(12) United States Patent
Ivanov et al.

(10) Patent No.: US 10,887,973 B2
(45) Date of Patent: *Jan. 5, 2021

(54) HIGH BRIGHTNESS LASER-PRODUCED PLASMA LIGHT SOURCE

(71) Applicants: Isteq B.V., Eindhoven (NL); RnD-ISAN, Ltd, Moscow (RU)

(72) Inventors: Vladimir Vitalievich Ivanov, Moscow (RU); Aleksandr Yurievich Vinokhodov, Moscow (RU); Konstantin Nikolaevich Koshelev, Moscow (RU); Mikhail Sergeyevich Krivokorytov, Moscow (RU); Vladimir Mikhailovich Krivtsun, Moscow (RU); Aleksandr Andreevich Lash, Moscow (RU); Vyacheslav Valerievich Medvedev, Moscow (RU); Yury Viktorovich Sidelnikov, Moscow (RU); Oleg Feliksovich Yakushev, Korolyev (RU); Oleg Borisovich Khristoforov, Moscow (RU); Denis Aleksandrovich Glushkov, Nieuwegein (NL); Samir Ellwi, Crawley (GB)

(73) Assignees: ISTEQ B.V., Eindhoven (NL); RnD-ISAN, Ltd, Moscow (RU)

( * ) Notice: Subject to any disclaimer, the term of this patent is extended or adjusted under 35 U.S.C. 154(b) by 0 days.

This patent is subject to a terminal disclaimer.

(21) Appl. No.: 16/773,240

(22) Filed: Jan. 27, 2020

(65) Prior Publication Data

US 2020/0163197 A1  May 21, 2020

Related U.S. Application Data

(63) Continuation-in-part of application No. 16/535,404, filed on Aug. 8, 2019, now Pat. No. 10,588,210,
(Continued)

(30) Foreign Application Priority Data

Apr. 26, 2019 (RU) .................. 2019113052
Jan. 25, 2020 (RU) .................. 2020103063

(51) Int. Cl.
*H05G 2/00* (2006.01)
*G03F 7/00* (2006.01)
*G03F 7/20* (2006.01)

(52) U.S. Cl.
CPC ......... *H05G 2/005* (2013.01); *G03F 7/70033* (2013.01); *G03F 7/70916* (2013.01); *H05G 2/008* (2013.01)

(58) Field of Classification Search
CPC ........ H05G 2/006; H05G 2/005; H05G 2/008; G03F 7/70033; G03F 7/70916
See application file for complete search history.

(56) References Cited

U.S. PATENT DOCUMENTS 10,588,210 B1 * 3/2020 Vinokhodov .......... H05G 2/005
10,638,588 B2 * 4/2020 Vinokhodov .......... H05G 2/006

* cited by examiner

*Primary Examiner* — Nicole M Ippolito
*Assistant Examiner* — Hanway Chang
(74) *Attorney, Agent, or Firm* — Nadya Reingand; Yan Hankin

(57) ABSTRACT

Laser-produced plasma light source contains a vacuum chamber with a rotating target assembly providing a target in an interaction zone with a laser beam focused on the said target, which is a molten metal layer. A debris shield is rigidly mounted to surround the interaction zone, said shield comprising only two opening forming an entrance for the laser beam and an exit for a short-wavelength radiation beam. The means for debris mitigation can additionally include: the rotation of target with high linear velocity exciding 80 m/s; the orientation of the short-wavelength radiation beam and/or of the laser beam at an angle of less than 45° to the target surface, a nozzle supplying a high- (Continued)

speed gas flow to the interaction zone, etc. The technical result is the creation of the high-brightness low-debris sources of soft X-ray, EUV and VUV light at wavelengths of 0.4 to 200 nm.

19 Claims, 4 Drawing Sheets

Related U.S. Application Data which is a continuation-in-part of application No. 16/103,243, filed on Aug. 14, 2018, now Pat. No. 10,638,588.

HIGH BRIGHTNESS LASER-PRODUCED PLASMA LIGHT SOURCE

CROSS-REFERENCE TO RELATED APPLICATIONS

This patent application is a Continuation-in-part of U.S. patent application Ser. No. 16/535,404, filed on Aug. 8, 2019, which in turn is a Continuation-in-part of U.S. patent application Ser. No. 16/103,243, filed on Aug. 14, 2018, which claims priority to Russian patent application RU2017141042 filed Nov. 24, 2017, the present application also claims priority to Russian patent application RU2020103063 filed Jan. 25, 2020, all of which are incorporated herein by reference in their entireties.

FIELD OF INVENTION

The invention refers to high brightness laser-produced plasma (LPP) light sources designed to generate soft X-ray, extreme ultraviolet (EUV) and vacuum ultraviolet (VUV) radiation at wavelengths of approximately 0.4 to 200 nm, which provide highly effective debris mitigation to ensure the long-term operation of the light source and its integrated equipment. Applications include soft X-ray and VUV metrology, microscopy, biomedical and medical diagnostics, and various types of controls, including inspection of lithographic EUV masks.

BACKGROUND OF INVENTION

High-intensity soft X-ray (0.4-10 nm), EUV (10-20 nm) and VUV (20-120 nm) light sources are used in many fields: microscopy, materials science, biomedical and medical diagnostics, materials testing, crystal and nanostructure analysis, atomic physics, and lithography. These sources are the basis of the analytical base of modern high-tech production and one of the main tools in the development of new materials and products based on them.

The light generation in these spectral ranges is most effective with the use of laser-produced plasma. Their development in recent years has been largely stimulated by the development of projection extreme ultraviolet (EUV) lithography for high-volume manufacturing of integrated circuits (ICs) with 10-nm node and below.

EUV lithography is based on the use of radiation in the range of 13.5+/−0.135 nm, corresponding to the effective reflection of multi-layer Mo/Si mirrors. One of the most important metrological processes of modern nanolithography is the control of ICs for the absence of defects. The general trend in lithographic production is a shift from ICs inspection to the analysis of lithographic masks. The process of mask inspection is most effectively carried out with the help of its scanning by actinic radiation, i.e. radiation, the wavelength of which coincides with the working wavelength of the lithograph (the so-called Actinic Inspection). Thus, the control of lithographic mask defect-free production and operation is one of the key problems of lithography, and the creation of a device for the diagnosis of lithographic masks and its key element, the high-brightness actinic source, is one of the priorities of the development of EUV lithography.

The radiation sources for EUV lithography are using Sn-plasma generated by a powerful laser system including $CO_2$ lasers. Such sources have the power of EUV radiation exceeding by several orders of magnitude the level of power required for the inspection of EUV masks. Therefore, their usage for mask inspection is inadequate due to the excessive complexity and cost. In this regard, there is a need for other approaches to the creation of high-brightness EUV sources for actinic inspection of EUV masks.

In accordance with one of the approaches known from the U.S. Pat. No. 8,344,339, issued on Mar. 1, 2012, a known device for the generation of EUV radiation from laser produced plasma including: a vacuum chamber, which houses a rotating rod made of plasma-forming target material, an input window for the laser beam focused in the interaction zone of the laser beam and target, and an EUV beam generated from the laser-produced plasma exiting an output window towards the optical collector. The device and the method of generation of EUV radiation are characterized by the fact that tin (Sn) is used as the most effective plasma-forming target material and the rod, in addition to rotation, also performs reciprocating axial movements. However, these devices and the method have a number of disadvantages, which include the non-reproducibility of the profile of the solid surface of the target from pulse to pulse during long-term continuous operation of the device, which affects the stability of the output characteristics of the short-wavelength radiation source. The complexity of the design is another disadvantage, since complex movements of the target assembly and its periodic replacement are required. During production of EUV radiation, debris particles are produced as a by-product, which can degrade the optics surface. The level of debris produced in this source is too high and that severely limits the possibilities of its application.

The debris, generated as a by-product of the plasma during the radiation source operation, can be in the form of high-energy ions, neutral atoms or vapors and clusters of target material.

The magnetic mitigation technique disclosed, for example, in the U.S. Pat. No. 8,519,366, issued Aug. 28, 2013, is arranged to apply a magnetic field so that charged debris particles are mitigated. In this patent the debris mitigation system for use in a short-wavelength radiation source, includes a rotatable foil trap and gas inlets for the supply of buffer gas to the foil trap so that neutral atoms and clusters of target material are effectively mitigated.

Patent application US 2013/0313423 A1, published Apr. 3, 2013, discloses a method of mitigating debris for an LPP light source, comprising directing an ionized plasma jet across a short-wavelength beam path. The plasma charges the debris particles, after which a pulsed electric field redirects the debris particles. The method is effective for mitigating the ion/vapor fraction of debris particles, for example, in LPP light sources using xenon as a target material. However, in LPP light sources using metals as the target material, the main threat to the optical elements is the micro-droplet fraction of debris particles, against which this method is not effective.

All of the above approaches to the construction of plasma light sources, as well as to debris mitigation techniques, fail to provide for a highly efficient suppression of the micro-droplet fraction of debris particles. This limits the lifetime of the equipment into which the light source is integrated due to earlier contamination of its optical elements.

One method for mitigating a micro-droplet fraction of debris particles, disclosed in U.S. Pat. No. 7,302,043, published Oct. 27, 2007, offers one potential solution. That method is arranged to apply a rotating shutter assembly configured to permit the passage of short-wavelength radiation through at least one aperture during the first period of rotation, and to thereafter rotate the shutter to obstruct passage of the debris through at least one aperture during the second period of rotation. However, the complexity of using such debris-mitigating techniques in a compact radiation source makes them technically too difficult to implement.

Accordingly, there exists a need for improved low-debris high-brightness LPP light sources.

SUMMARY

The technical problem to be solved by the invention relates to the creation of compact sources of high brightness X-ray, EUV and VUV radiation with mitigation of the flow of debris particles in the paths of the laser beam and short-wavelength radiation beam used.

Achievement of the purpose is possible by means of a laser-produced plasma light source, comprising a vacuum chamber with a rotating target assembly providing a target in an interaction zone with a laser beam focused on the target, which is a molten metal, a useful short-wavelength radiation beam exiting the interaction zone and means for debris mitigation.

The laser-produced plasma light source is characterized in that a debris shield is rigidly mounted to surround the interaction zone, said shield comprising a first opening forming an entrance for said laser beam and a second opening forming an exit for a short-wavelength radiation beam.

In a preferred embodiment of the invention, target is the molten metal layer, formed by centrifugal force on a facing to an axis of rotation surface of an annular groove, implemented in the rotating target assembly.

In a preferred embodiment of the invention, the debris shield is circular.

In the preferred embodiment of the invention, slit gaps separate the shield from the rotating target assembly In the embodiment of the invention, at least one of the first and second openings in the debris shield is conical.

In the embodiment of the invention, an axis of short wavelength radiation beam is directed at an angle of greater than 45° relative to a rotation plane of the rotating target assembly.

In the embodiment of the invention, the rotating target assembly rotates with a linear velocity exceeding 80 m/s and one or more debris mitigation techniques such as protective gas flows, electrostatic and magnetic mitigation, foil traps and a membrane comprising carbon nanotubes are additionally used.

In a preferred embodiment of the invention, at least parts of the focused laser beam and the short-wavelength radiation beam are surrounded by casings in which a protective gas flows are supplied.

In the embodiment of the invention, the short-wavelength radiation beam comprises light, having wavelengths in the rage of 0.4 nm to 120 nm.

In a preferred embodiment of the invention, the molten metal comprises Sn, Li, In, Ga, Pb, Bi, Zn, and/or alloys thereof.

In the embodiment of the invention, the laser-produced plasma light source comprises a nozzle, said nozzle supplying a high-speed gas flow to the interaction zone.

In the embodiment of the invention, the nozzle is positioned in the first opening and the laser beam is directed into the interaction zone through the nozzle In the embodiment of the invention, the gas comprises a noble gas.

In the embodiment of the invention, a gas flow velocity to the interaction zone is between 60 m/s and 300 m/s, and wherein a gas pressure within the interaction zone is between 5 mbar to 200 mbar.

In the embodiment of the invention, the nozzle is positioned at a distance of no greater than 2 mm from the interaction zone.

In the embodiment of the invention, the gas flow towards the interaction zone is directed to a vector of linear velocity of the target at an angle not exceeding 45 degrees.

In the embodiment of the invention, the direction from interaction zone towards at least one of the first and second openings in the debris shield is significantly different from the direction of a predominant output of a droplet fraction and/or of ion/vapor fraction of debris particles from the interaction zone.

In a preferred embodiment of the invention, a vector of the linear velocity of the target in the interaction zone and at least one of the first and second openings in the debris shield are located on different sides of a plane passing through the interaction zone and the axis of rotation.

In the embodiment of the invention, the axis of at least one of the first and second openings in the debris shield is directed at an angle of less than 45° relative to a target surface in the interaction zone.

The technical result of the invention is the creation of X-ray, EUV and VUV radiation sources of high brightness with deep debris mitigation, characterized by increased service life, ease of operation and lower operating costs.

The advantages and features of the present invention will become more apparent from the following non-limiting description of exemplary embodiments thereof, given by way of example with reference to the accompanying drawings.

BRIEF DESCRIPTION OF THE DRAWINGS

Essence of the invention is explained by drawings wherein.

In the drawings, the matching elements of the device have the same reference numbers.

These drawings do not cover and, moreover, do not limit the entire scope of options for implementing this technical solution, and they are only illustrative examples of particular cases of its implementation.

DETAILED DESCRIPTION OF THE PREFERRED EMBODIMENTS

Figure 1:
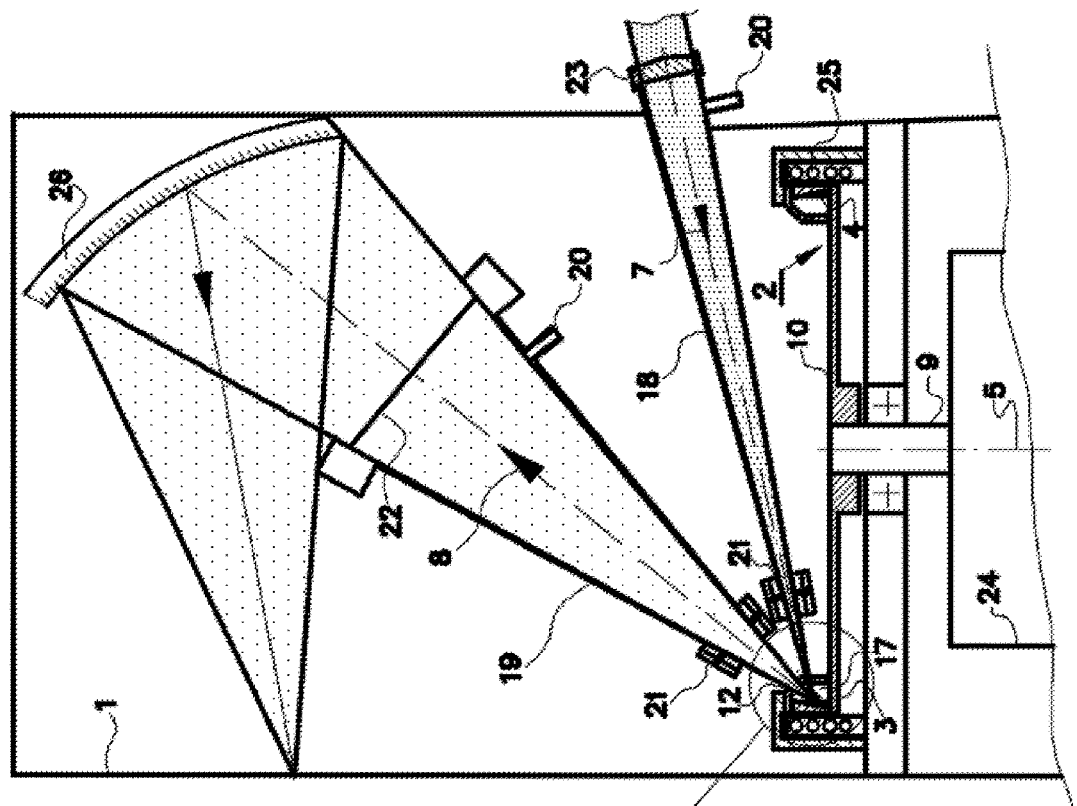
FIG. 1, FIG. 2, FIG. 3—schematic of the high-brightness laser-produced plasma light source according to embodiments of this invention.
Figure 1:
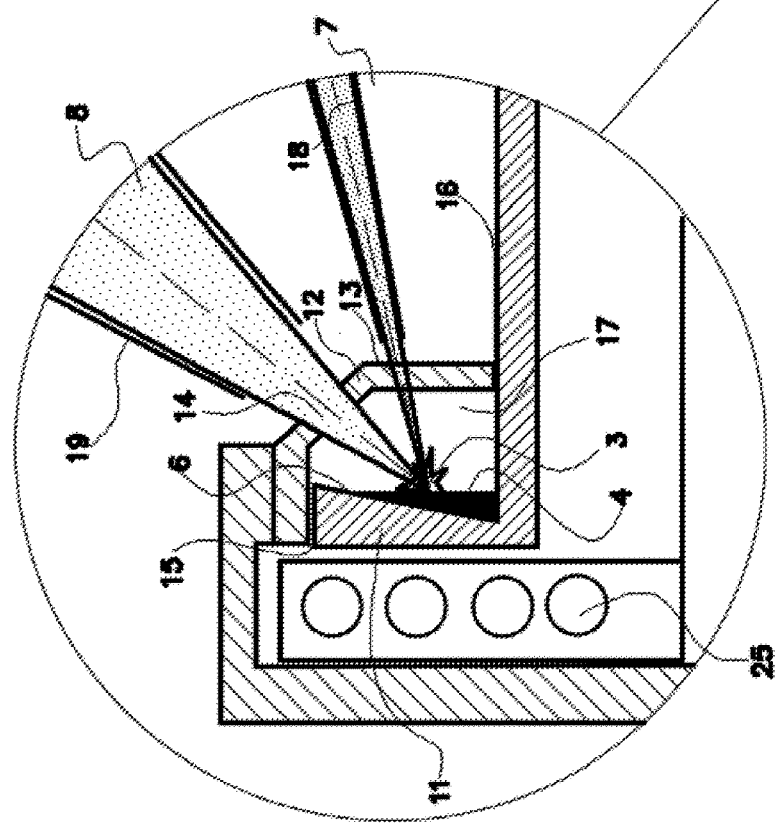

According to an example of invention embodiment illustrated in FIG. 1, the high-brightness laser-produced plasma light source comprises the vacuum chamber 1 with the rotating target assembly 2, which provides the target 4 being a layer of molten metal into the interaction zone 3. The above-mentioned layer of molten metal is formed by the centrifugal force on the surface of the annular groove 6 of the rotating target assembly facing the rotation axis 5. The laser beam 7 generated by the high pulse repetition rate laser is focused on the target in the interaction zone 3. Interaction of the focused laser beam with the target in the interaction zone 3 results in producing high-temperature plasma of the target material. The laser-produced plasma emits light in the short-wavelength range including wavelengths of 0.4 to 120 nm. Utilized plasma emission is the useful short-wavelength radiation beam 8 exiting the interaction zone 3 outside the rotating target assembly to be used in the instrumentation integrated with the light source. As a by-product, debris particles, which include micro droplets, vapors and ions of the target material, are generated in the interaction zone. To ensure that the high-brightness laser-produced plasma light source is clean, it comprises the means of debris mitigation.

The rotating target assembly 2 is preferably designed as the disc 10 fixed to the rotation shaft 9 having a peripheral part designed as the circular barrier 11. On the internal surface of the circular barrier 11 facing the rotation axis 5 there is the annular groove 7. Further, the annular groove 7 has a surface facing the rotation axis 5. At the same time, the annular groove configuration prevents material of the target 4 from being discharged in the radial direction and in both directions along the rotation axis 5, if the target material volume does not exceed the groove's volume.

The annular groove 6 in the invention embodiment shown in FIG. 1 is formed by the peripheral part of the disc 10 and the circular barrier 11 having a conical internal surface facing the rotation axis 5. Other options of the groove's configuration are also acceptable.

A sufficiently high rotation speed is employed whereby the effect of the centrifugal force makes the surface of the liquid metal target 4 parallel to the rotation axis 5, i.e. it is essentially a circular cylindrical surface whose axis coincides with the rotation axis 5, FIG. 1.

The target material is kept in molten state by the power of laser radiation absorbed by the target. For initial melting of the target material the special heating device 25 may be employed, in which induction heating is used in the particular embodiment of invention.

According to the invention, the debris shield 12 is used as one of the means of debris mitigation. The shield 12 is rigidly mounted in order to surround the interaction zone 3; whereby the said shield comprises the first opening 13 forming the entrance for the laser beam 7, and the second opening 14 forming the exit for the useful short-wavelength radiation beam 8.

Preferably, the shield 12 is designed to be circular. However, in an embodiment of invention the shield 12 may be located opposite the angular sector of the target 4 near the interaction zone 3, and can be separated from it by slit gaps on the ends.

Availability of the shield 12 results in deep mitigation of the debris particles output from the rotating target assembly and their return into the groove 6 after output from interaction zone. For deeper debris mitigation the shield 12 is separated from the rotating target assembly 2 by means of the slit gaps 15, 16, FIG. 1. In this case the target is located in the basically closed cavity 17 formed by surfaces of the groove 6 and the shield 12. Debris particles generated along with radiation in the interaction zone 3 can exit the cavity 17 only through two small opening 13, 14.

In the invention embodiments the first and the second openings 13, 14 in the shield 12 are designed to be conical, and the apices of conical openings are located in the interaction zone 3. This allows to minimize the aperture of the openings 13, 14 in order to trap contaminants in the cavity 17 more efficiently.

Besides, according to the invention other means of debris mitigation are located in the pathway of the short-wavelength radiation beam 8, as well as in the pathway of the laser beam 7. Preferably, the means of debris mitigation comprise the conical casings 18, 19, which surround the laser beam 7 and the short-wavelength radiation beam 8; the gas inlets 20; the magnetic field sources, for example, in the form of the permanent magnets 21, the electrostatic field sources (not shown), the foil traps (not shown), the replaceable CNT-membrane 22.

According to the invention, to ensure highly efficient generation of radiation at different wavelengths in the range of 0.4 to 120 nm, the target material is preferably selected from the group of nontoxic fusible metals, including Sn, Li, In, Ga, Pb, Bi, Zn and their alloys.

To obtain radiation in the wavelength rage of over 20 nm, the CNT-membrane 22 is not used, as its transparency in the said range falls significantly with increasing the radiation wavelength.

The light source also comprises the inlet window 23 intended for introducing the laser beam 7, the rotation drive unit 24 of the target assembly, and the target heater 25 designed for initial melting of the target material 4.

The collector mirror 26 can be included into the scope of equipment using short-wavelength radiation.

Preferably, the target linear velocity is over 80 m/s. This allows to reduce discharge of the droplet fraction of debris particles out of the rotating target assembly significantly (by orders of magnitude) towards the openings 13, 14 in the shield 12 as compared to lower linear velocities.

Figure 2:
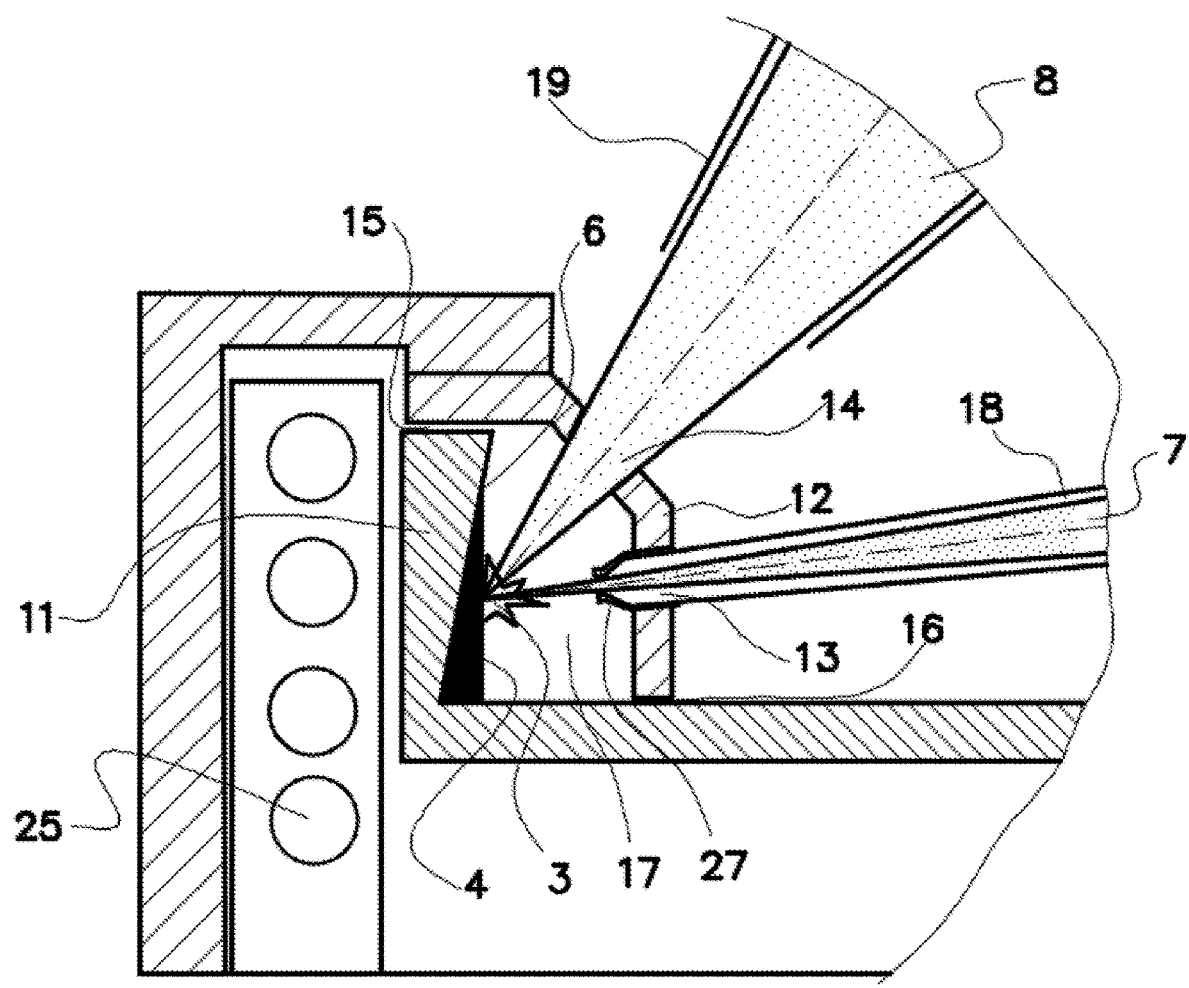

In embodiments of invention, one of which is schematically shown in FIG. 2, to ensure a deeper mitigation of the ionic/vapor fraction of the debris particles, the nozzle 27 is introduced designed to form a high-speed gas flow directed into the interaction zone 3.

Part of the conical casing 18 entering the cavity 17 through the shield opening 13 can serve as the nozzle 27, as schematically shown in FIG. 2. In these embodiments of invention, the focused laser beam 7 is directed into the interaction zone 3 through the nozzle 27. As a result, deep mitigation ionic/vapor fraction of the debris particles is ensured in the pathway of the laser beam 7.

Figure 3:
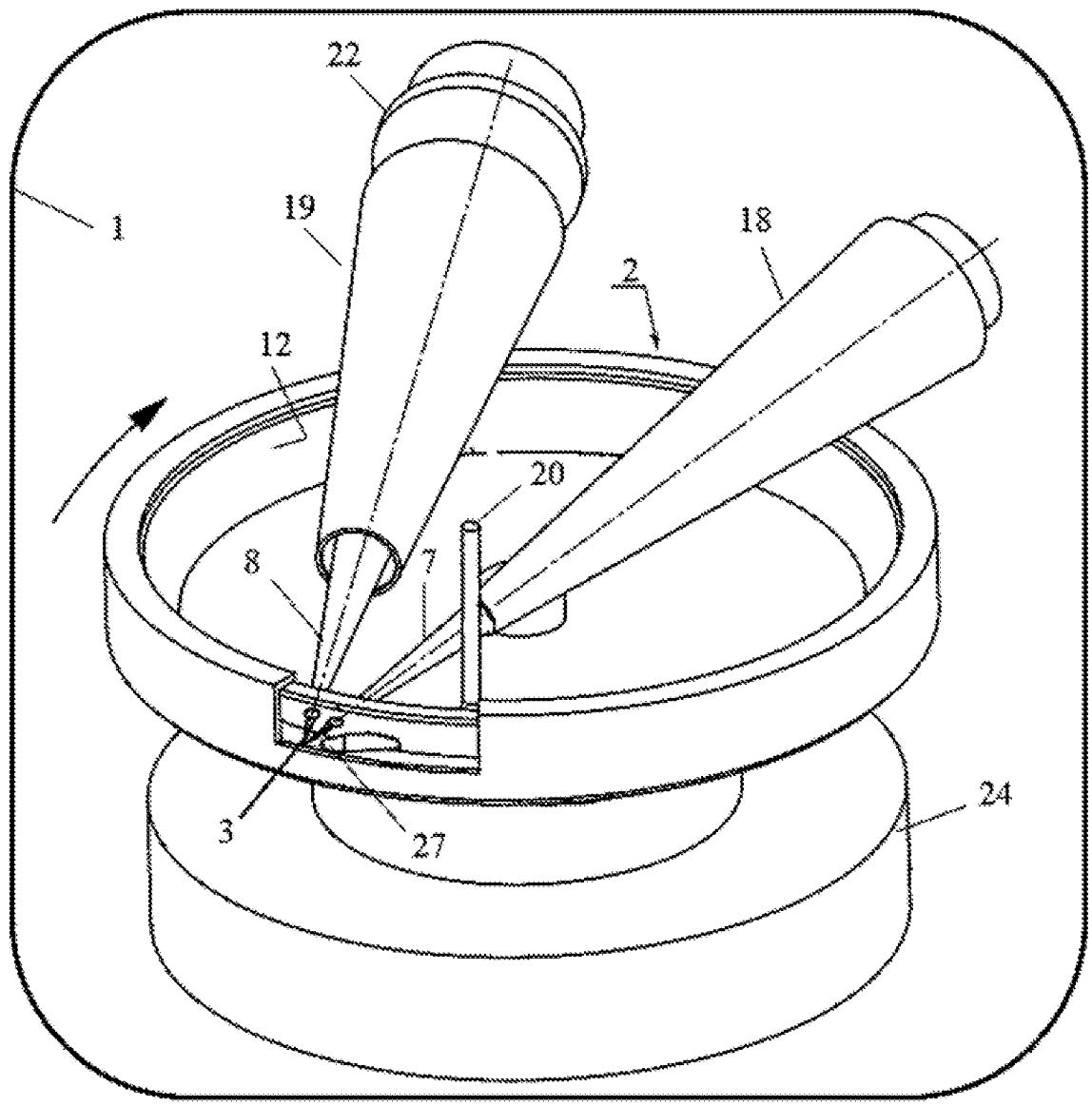

In other embodiments of invention, the high-speed gas flow directed into the interaction zone 3 can be formed by the separately located nozzle 27, as illustrated by FIG. 3.

Argon or other inert gases and their mixtures are preferably used for blowing gas through the nozzle 27. Efficient mitigation of the ionic/vapor fraction of the debris particles is ensured when the speed of protective buffer gas flow directed into the interaction zone 3 is between 60 and 300 m/s and its pressure is 5 to 200 mbar. In order to ensure the above-mentioned gas flow parameters, the nozzle is preferably located at a small (not exceeding 2 mm) distance from the interaction zone 3.

According to the invention, further means of debris mitigation in the pathway of the laser and short-wavelength radiation beams 7, 8 consist in such a configuration of the laser-produced plasma light source, whereby the direction of the predominant output of the debris particles from the interaction zone is significantly different from the direction towards the openings 13, 14 in the shield 15.

Figure 4A:
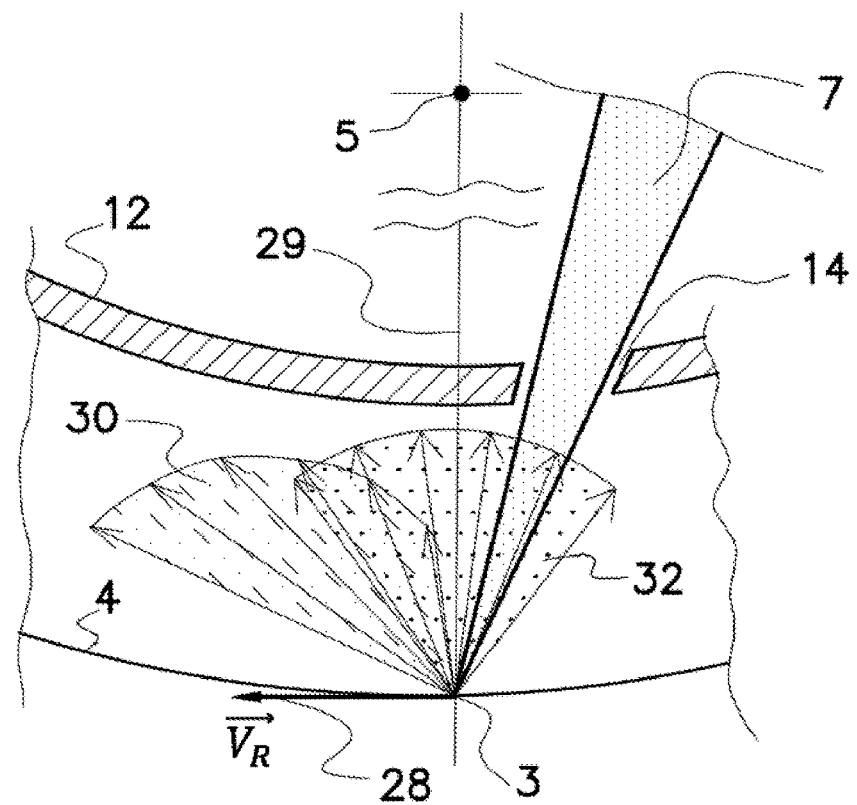
FIG. 4A and FIG. 4B—light source cross-section in the rotation plane of the rotating target assembly 2 and relative spread velocity diagrams of the droplet and ionic/vapor fractions of the debris particles for different embodiments of invention.
Figure 4B:
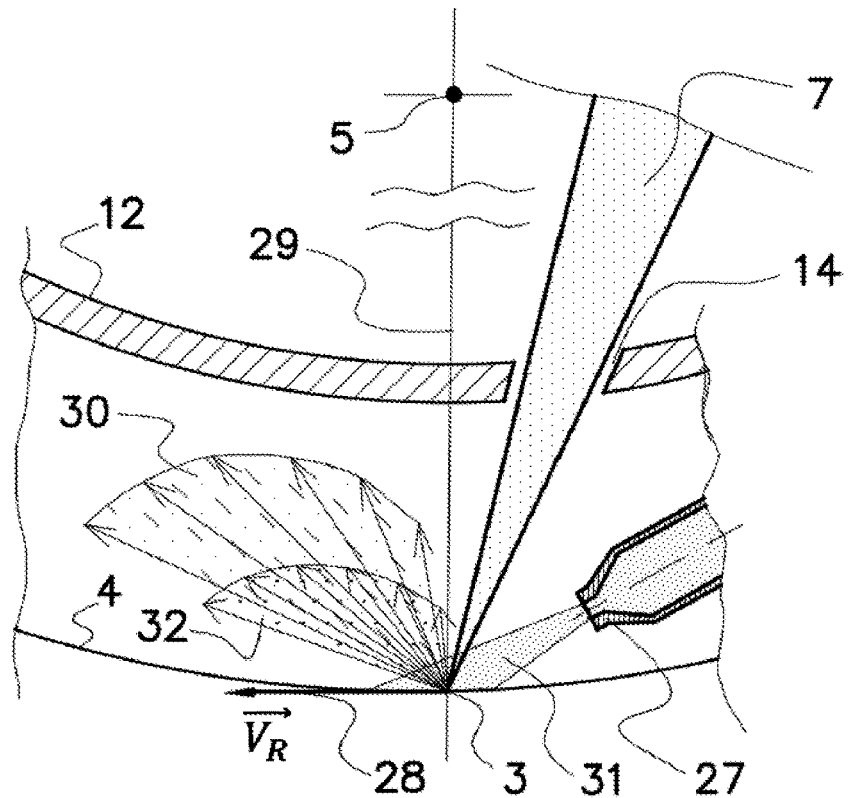

In FIG. 4A and FIG. 4B the light source cross-section in the rotation plane passing through the interaction zone, is schematically shown for embodiments of invention without the nozzle, FIG. 4A, and with the nozzle, FIG. 4B. Also, spread velocity diagrams of the droplet fraction 30 of the debris particles and of the ionic/vapor fraction 32 of the debris particles are schematically shown. As velocities of these two fractions can differ by as much as nearly an order of magnitude, diagrams are presented where the velocities are given relative to their maximum values.

As can be seen in FIG. 4A, the prevailing spread direction of the relatively slow droplet fraction of the debris particles 30 deviates towards the vector 28 of the target linear velocity $\vec{V}_R$ in the interaction zone. Consequently, as one of the means of debris mitigation, a configuration of the light source is used, whereby the vector 28 of the target linear velocity in the interaction zone and at least one of the first and the second openings 13, 14 in the shield 12 are preferably located on different sides of the plane 29 passing through the interaction zone 3 and the rotation axis 5.

As illustrated in FIG. 4A, linear target velocity $V_R$ has almost no effect on the spread direction of the ionic/vapor fraction 32 of debris particles. The direction of ions and vapors spread from the interaction zone 3 lies in the conically shaped area 32 whose axis is directed along the normal vector to the target surface in the interaction zone 3, and the apex angle does not exceed 90°. Consequently, in the embodiments of invention, a configuration of the light source is used as one of the means of debris mitigation, whereby at least one out of the radiation beam axes 7, 8 or of the openings 13, 14 is directed at an angle less 45 degrees to the target surface in the interaction zone. These embodiments of invention are illustrated in FIG. 1, FIG. 2, FIG. 3, where the short-wavelength radiation beam axis 8 and, correspondingly, the axis of the second opening 14, are directed at an angle of over 45° to the rotation plane of the rotating target assembly 2 and at an angle less than 45 degrees to the target surface in the interaction zone.

In embodiments of invention illustrated in FIG. 4B the gas flow out of the nozzle 27 is directed into the interaction zone 3 at an angle to the vector 28 of the target linear velocity $\vec{V}_R$ that does not exceed 45 degrees. Due to this the direction of the predominant output of ionic/vapor fraction 32 from the interaction zone also deviates towards the vector 28 of the target linear velocity $\vec{V}_R$ and, as well as the droplet fraction 30, is not directed towards the first and the second openings 13, 14 in the shield 12.

All of the above-mentioned, as well as using other means for debris mitigation, ensures efficient protection of the laser and short-wavelength radiation beams 7, 8 pathways both from the ionic/vapor and from the droplet fractions of debris particles.

The high-brightness laser-produced plasma light source is operated as described below.

The vacuum chamber 1 is evacuated using the oil-free vacuum pump system (not shown) to the pressure below $10^{-5}$-$10^{-8}$ mbar. At the same time, gas components, such as nitrogen, oxygen, carbon, etc., capable of interacting with the target material, are removed. After light source power-on the target material is transferred into molten state using the fixed heating device 25 which may employ induction heating, FIG. 1.

The rotating target assembly 2 is actuated using the rotating drive unit 24, for example, an electric motor with a magnetic coupling, which ensures cleanliness of the vacuum chamber 1. Under the action of the centrifugal force the target 4 is formed as the molten metal layer on the surface of the annular groove 6 directed towards the rotation axis 5.

The target 4 is exposed to the focused laser beam 7 with a high pulse repetition rate that can be in the range of 1 kHz to 1 MHz. Short-wavelength radiation is generated by the laser beam heating the target material to a plasma-forming temperature. The laser-produced plasma emits light in the short-wavelength range including wavelengths of 0.4 to 120 nm. Depending on the laser radiation power density in the focal spot and the target material, short-wavelength radiation is generated mainly in the soft X-ray (0.4-10 nm) and/or EUV (10-20 nm) and/or VUV (20-120 nm) range.

Heat transfer from the target is ensured via the narrow (~0.2-0.4 mm) gap between the rotating target assembly 2 and the fixed water-cooled sink (not shown) through which gas is blown at the pressure of ~1 mbar. Gas conductivity and area of contact are sufficient to remove up to 1.5 kW of thermal power for this type of cooling. At the same time, other cooling methods may be used for the rotating target assembly.

The short-wavelength radiation beam 8 is coming out of the high-temperature laser-produced plasma generated in the interaction zone 3, preferably, via the CNT-membrane 22 installed in the line-of-sight area of the interaction zone 3 and completely overlapping the aperture of the short-wavelength radiation beam 8. The CNT-membrane 22 ensures discharge of the short-wavelength radiation beam due to its high (80-90%) transparency in the wavelength range below 20 nm. Simultaneously, the CNT-membrane 22 prevents debris particles from passing through, which ensures deep debris mitigation in the pathways to the collector mirror 26.

An important component of the technology to suppress the droplet fraction of debris particles is using a high linear velocity of the target which translates significant tangential velocity components to the droplets. This allows to redirect the bulk of the droplets sideways of the optical axes of the laser and short-wavelength radiation beams 7, 8. In the embodiment of invention the target material is tin (Sn) or its alloy. This ensures a high conversion efficiency in the (13.5+/−0.135) nm spectral band used in manufacturing and metrology processes of EUV lithography. For a Sn-target the maximum spreading speed of the droplets is less than 100 m/s. Consequently, the target linear velocity over 80 m/s is used in embodiments of inventions, which, as demonstrated by calculations and measurements, achieves highly efficient mitigation of the droplet fraction of debris particles.

According to the invention, the interaction zone 3 is covered by the fixed circular shield 12 separated by the minimum slit gaps 15, 16 from the rotating target assembly and forming the basically closed cavity 17 around the target 4, the cavity having only two openings 13, 14 for the laser and short-wavelength radiation beams 7, 8. Due to the fact that the droplets velocity vector is mainly directed along the vector of the target linear velocity away from the openings 13, 14, the largest part of the droplet fraction of the debris particles after bouncing off the walls of the cavity 17 multiple times, remains inside it. At the same time, it is ensured that the largest part of the debris particles is returned into the annular groove 6, as the temperature of the circular shield 12 near the interaction zone is maintained above the target material melting temperature by the plasma and radiation generated in the interaction zone 3.

According to the invention, output of short-wavelength radiation at from interaction zone an angle over 45° to the rotation plane helps reduce the flow of the droplet fraction of the debris particles by several times, and the flow of ionic/vapor fraction—by an order of magnitude. This happens because the indicatrix of debris particles spread from the interaction zone is a heterogeneous one. At the same time, intensity of the short-wavelength radiation under these angles varies insignificantly in relation to the angles of emission in the range of 0° to 45°.

In embodiments of invention the high-speed gas flow out of the nozzle 27 is used. It can be essentially a part of the conically-shaped casing 18 surrounding the laser beam, FIG. 2, or be a separate device as shown in FIG. 3, FIG. 4b.

In the embodiments of invention, the gas flow is directed into the interaction zone 3 through the nozzle 27 at a small angle to the linear velocity vector 28 of the target 4, not exceeding 45 degrees, FIG. 3, FIG. 4b.

The nozzle 27 is located near the interaction zone at a small distance of 1-2 mm, so that the gas jet has a comparable momentum value relative to the momentum values of plasma and vapors spreading from the interaction zone. As a result of the interaction with the gas jet, the prevailing direction of ions and vapors spreading is deflected from the original direction, and the contaminant flow is not directed towards the beam pathways 7, 8 of the laser and short-wavelength radiation. On the one hand, pressure in the gas flow must be high enough to efficiently deflect the spreading plasma and vapors, and on the other hand, it must not exceed the pressure under which an excessively high (over 20%) short-wavelength radiation absorption is observed near the interaction zone 3. As demonstrated by evaluations, such a compromise is achieved if the appropriate speed of the vacuum chamber 1 evacuation is ensured.

In embodiments of invention, additionally, such means of debris mitigation as the electrostatic and magnetic fields, the directed flows of protective gas and the foil traps (not shown) in front of the optical elements 23, 26 are used. Accordingly, in the fixed casings 18, 19 that surround a part of the laser beam 7 and a part of the short-wavelength radiation beam 8, using the gas inlets 20, protective buffer gas is continuously blown between the CNT-membrane 22 and the inlet window 23 towards the interaction zone 3, FIG. 1. The gas flows protect the inlet window 23 and the CNT-membrane 22 from the ionic/vapor fraction of the debris particles, depositing contaminants on the walls of casings 18, 19 or of the foil traps (not shown).

Charged particles are also deposited on the surface of casings 18, 19 using the magnetic field generated by the permanent magnets 21 located on the external surface of the casings 18, 19 near the interaction zone 3. The magnetic fields are preferably oriented cross-wise to the axis of the short-wavelength radiation beam 8 and the laser beam 7 which allows to deflect the charged particles from rectilinear motion to the CNT-membrane 22 and to the inlet window 23. This helps to increase the lifetime of the CNT-membrane 22 and of the inlet window 23 before replacement.

Thus, this invention allows to create soft X-ray, EUV and VUV radiation sources with the highest brightness, long lifetime, and easy to use.

INDUSTRIAL APPLICABILITY

The proposed devices are designed for a number of applications, including microscopy, materials science, diagnostics of materials, biomedical and medical diagnostics, inspection of nano- and microstructures, including actinic inspection of lithographic EUV masks.

What is claimed is:

1. A laser-produced plasma light source, comprising a vacuum chamber (1) with a rotating target assembly (2) providing a target in an interaction zone (3) with a laser beam (7) focused on the target (4), which is a molten metal, a useful short-wavelength radiation beam (8) exiting the interaction zone and means for debris mitigation, characterized in that
a debris shield (12) is rigidly mounted to surround the interaction zone (3), said shield comprising a first opening (13) forming an entrance for said laser beam (7) and a second opening (14) forming an exit for a short-wavelength radiation beam (8).

2. The laser-produced plasma light source according to claim 1, wherein the target is the molten metal layer, formed by a centrifugal force on a facing to an axis of rotation (5) surface of an annular groove (6), implemented in the rotating target assembly.

3. The laser-produced plasma light source according to claim 1, wherein the debris shield (12) is circular.

4. The laser-produced plasma light source according to claim 1, wherein slit gaps (15), (16) separate the shield from the rotating target assembly.

5. The laser-produced plasma light source according to claim 1, wherein at least one of the first and second openings in the debris shield is conical.

6. The laser-produced plasma light source according to claim 1, wherein an axis of short wavelength radiation beam is directed at an angle of greater than 45° relative to a rotation plane of the rotating target assembly.

7. The laser-produced plasma light source according to claim 1, wherein the rotating target assembly rotates the target with a linear velocity exceeding 80 m/s and one or more debris mitigation techniques such as protective gas flows, electrostatic and magnetic mitigation, foil traps and a membrane comprising carbon nanotubes are additionally used.

8. The laser-produced plasma light source according to claim 1, wherein at least parts of the focused laser beam (7) and the short-wavelength radiation beam (8) are surrounded by casings (18), (19) in which a protective gas flows are supplied.

9. The laser-produced plasma light source according to claim 1, wherein the short-wavelength radiation beam comprises light, having wavelengths in the rage of 0.4 nm to 120 nm.

10. The laser-produced plasma light source according to claim 1, wherein the molten metal comprises Sn, Li, In, Ga, Pb, Bi, Zn, and/or alloys thereof.

11. The laser-produced plasma light source according to claim 1, further comprising a nozzle (27), said nozzle supplying a high-speed gas flow to the interaction zone.

12. The laser-produced plasma light source according to claim 11, wherein the nozzle is positioned in the first opening and the laser beam is directed into the interaction zone through the nozzle (27).

13. The laser-produced plasma light source according to claim 11, wherein the gas comprises a noble gas.

14. The laser-produced plasma light source according to claim 11, wherein a gas flow velocity to the interaction zone is between 60 m/s and 300 m/s, and wherein a gas pressure within the interaction zone is between 5 mbar to 200 mbar.

15. The laser-produced plasma light source according to claim 11, wherein the nozzle is positioned at a distance of no greater than 2 mm from the interaction zone.

16. The laser-produced plasma light source according to claim 11, wherein the gas flow (31) towards the interaction zone (3) is directed to a vector (28) of linear velocity of the target at an angle not exceeding 45 degrees.

17. The light source according to claim 1, wherein the direction from interaction zone towards at least one of the first and second openings (13), (14) in the debris shield is significantly different from the direction of a predominant output of a droplet fraction (30) and/or of ion/vapor fraction (32) of debris particles from the interaction zone.

18. The laser-produced plasma light source according to claim 16, wherein a vector (28) of the linear velocity of the target in the interaction zone and at least one of the first and second openings (13), (14) in the debris shield are located on different sides of a plane (29) passing through the interaction zone (3) and the axis of rotation (5).

19. The laser-produced plasma light source according to claim 16, wherein the axis of at least one of the first and second openings in the debris shield is directed at an angle of less than 45° relative to a target surface in the interaction zone.

\* \* \* \* \*